United States Patent [19]

Davies et al.

[11] Patent Number: 4,485,319
[45] Date of Patent: Nov. 27, 1984

[54] BUBBLE MEMORY SENSE AMPLIFIER

[75] Inventors: Robert B. Davies, Tempe; Robert N. Dotson, Mesa; Ira Miller, Tempe, all of Ariz.

[73] Assignee: Motorola, Inc., Schaumburg, Ill.

[21] Appl. No.: 352,989

[22] Filed: Feb. 26, 1982

[51] Int. Cl.³ .................. H03K 5/159; H03K 17/00; G11C 19/08

[52] U.S. Cl. .................. 307/530; 307/352; 328/145; 328/151; 365/8

[58] Field of Search ............ 307/351, 352, 353, 494, 307/530; 328/151, 148, 146, 147; 365/8, 7, 158

[56] References Cited

U.S. PATENT DOCUMENTS

| | | | |
|---|---|---|---|
| 4,035,785 | 1/1977 | Kryder | 365/8 |
| 4,121,119 | 10/1978 | Meigs et al. | 328/151 |
| 4,174,539 | 11/1979 | Timm | 365/8 |
| 4,253,057 | 2/1981 | Carlton et al. | 328/148 |
| 4,261,044 | 4/1981 | Classon et al. | 365/8 |
| 4,293,930 | 10/1981 | Van Reynerdal | 365/8 |
| 4,369,501 | 1/1983 | Brown et al. | 365/8 |
| 4,388,699 | 6/1983 | Balakrishnan | 365/8 |

Primary Examiner—John S. Heyman
Assistant Examiner—Timothy P. Callahan
Attorney, Agent, or Firm—Joe E. Barbee

[57] ABSTRACT

A sense amplifier which is fully integrated has an on-chip voltage regulator to provide essentially error free operation. The sense amplifier provides peak-to-peak signal detection for comparison to a threshold voltage by a comparator. The output of the comparator is coupled to an RS flip-flop. The output of the RS flip-flop is coupled to a D flip-flop. The use of an RS flip-flop as well as a D flip-flop eliminates clocking problems caused by skewing and keeps a stored detected signal from changing prematurely.

12 Claims, 3 Drawing Figures

BUBBLE MEMORY SENSE AMPLIFIER

This invention relates, in general, to sense amplifiers, and more particularly, to a sense amplifier useful in a bubble memory system.

Sense amplifier is a term which is applied to a circuit used to sense low level voltages. Such low level voltages are typically associated with memory systems. A sense amplifier must be capable of distinguishing the low voltage signal from noise and amplifying the low level voltage to be compatible with logic levels associated with the memory system. Bubble memories typically produce very low level signals in an extremely noisy environment. The low level signals in a magnetic bubble memory device are usually generated by the use of a pair of closely matched resistive detectors. One of the closely matched detectors serves as a reference whereas the other serves as the sensing element. The low level signal is generated when a bubble stored in the bubble memory is made to pass adjacent the sensing detector. The low level signal is generated due to a change in resistance of the sensing detector. Considerable noise is developed in the bubble memory system by the circuitry used to cause the bubble to pass adjacent to the sensing detector.

It is highly important to have a sense amplifier capable of distinguishing between noise and a bubble. In the past, sense amplifiers have usually been built to operate with only one type of bubble memories. In some cases, a sense amplifier had to be matched to a particular bubble memory device. As bubble memory devices become more prevalent it is important to have a sense amplifier which can be used with more than one type of bubble memory device and which does not have to be matched to a particular device and yet which is capable of consistently distinguishing a bubble signal from noise.

Accordingly, it is an object of the present invention to provide an improved sense amplifier which is particularly useful with bubble memory devices.

Yet another object of the present invention is to provide a sense amplifier using improved strobing techiques to eliminate timing skew problems.

A further object of the present invention is to provide a sense amplifier having separate threshold levels which are easily selected.

Yet a further object of the present invention is to provide an improved sense amplifier having a voltage regulator which is integrated onto the same integrated circuit chip as the sense amplifier to reduce noise problems.

SUMMARY OF THE INVENTION

The above and other objects and advantages of the present invention are provided by a new and improved sense amplifier. A sense amplifier receives a low level voltage signal which is amplified by an input amplifier. The output of the input amplifier is coupled to a filtering amplifier which drives a current source with a filtered output. The current source is used to charge a storing means during one polarity of the low level voltage signal. A comparator is coupled to the storing means where a comparison is made with a known reference. If the input signal to the comparator exceeds a known reference, an output is provided which is temporarily stored in logic circuitry where it is gated out by a strobe signal.

DETAILED DESCRIPTION OF THE DRAWINGS

Figure 1:
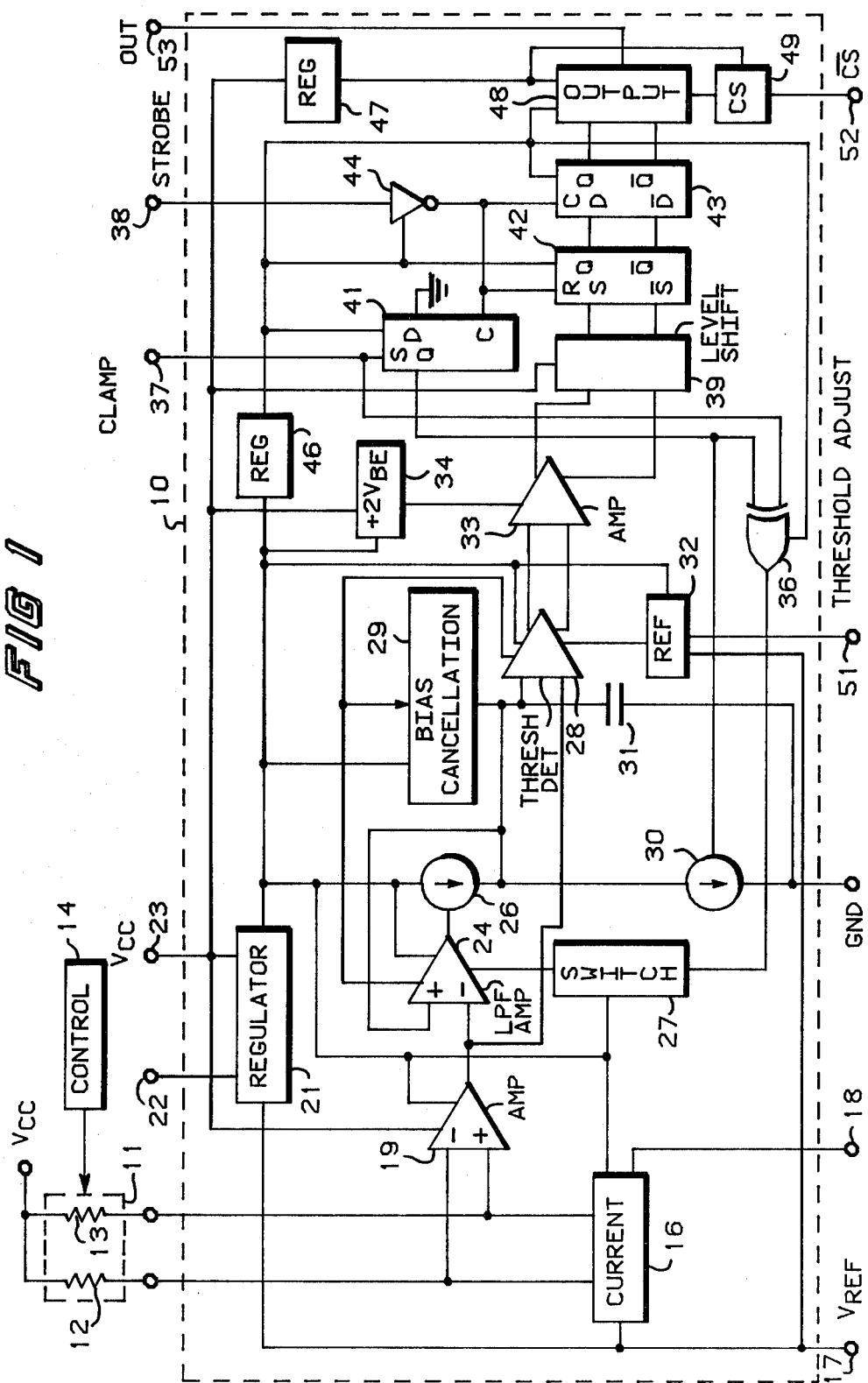
FIG. 1 illustrates in block diagram form an embodiment of the invention in one form.

FIG. 1 shows sense amplifier 10 coupled to a magnetic bubble memory device. A portion of the bubble memory device is illustrated as enclosed within dotted line 11. Two resistive elements 12 and 13 are located on the bubble memory device and serve as detectors to detect bubbles stored within the bubble memory. One resistive detector, such as 12, serves as the sensor while the other resistive detector, such as 13, serves as a dummy or reference for input amplifier 19. A control circuitry 14 is also coupled to bubble memory device 11 and provides the necessary controls to operate the bubble memory and to cause bubbles to pass near resistive detector 12. Typically the bubble is made to pass under detector 12 which causes a slight resistive change in detector 12. Detectors 12 and 13 are coupled between a voltage source, $V_{CC}$, and a constant current pair reference 16. Constant current reference 16 provides a predetermined matched current pair output which is controlled by a voltage reference applied to terminal 17 and a resistor (not shown) connected from terminal 18 to ground. As a bubble passing adjacent to resistive detector 12 causes its resistance to change amplifier 19 will sense a difference in voltage between its non-inverting input and its inverting input. This difference in voltage is amplified by amplifier 19. Since the bubble does not pass adjacent to reference detector 13 its resistance will not change. Constant current reference 16 has an input coupled to terminal 18. This input serves to make sense amplifier 10 more versatile. A resistor connected from terminal 18 to ground can be used to control the amount of current provided by constant current reference 16. This option is desirable since different manufacturers provide different values of resistive detectors 12 and 13 on their bubble memory devices. Constant current reference 16 is powered by voltage provided from regulator 21.

The reference voltage applied to terminal 17 is also connected to a high frequency ripple rejection regulator 21. Regulator 21 provides the basic regulated voltage for sense amplifier 10. Regulator 21 is powered by voltage $V_{CC}$ which is applied to terminal 23. Regulator 21 is also coupled to an optional terminal 22 for use in an extremely noisy environment. When additional noise rejection is required terminal 22 can be coupled to $V_{CC}$ by a capacitor to assist regulator 21 in rejecting noise. In a preferred embodiment, regulator 21 will provide a regulated output voltage of 8.25 volts.

The input stages of amplifier 19 are powered by voltage $V_{CC}$ appearing at terminal 23 while the output stage is powered by regulator 21. By having the input stage of amplifier 19 powered by voltage $V_{CC}$, a higher common mode range is obtained since resistive detectors 12 and 13 are powered by $V_{CC}$ also. The amplified output provided by amplifier 19 is first coupled to an inverting input of amplifier 24 which also serves as a low pass filter. The filtering provision for amplifier 24 is achieved through the use of PNP transistors. Not only do PNP transistors provide the correct level shifts and input impedances, they also limit the frequency response of a circuit thereby providing rejection of unwanted signals resulting from system noise such as fast rise and fall noise spikes from the X and Y coil currents associated with magnetic bubble memory device 11. The PNP transistors respond to the bubble rise and fall time but not to the noise spikes thereby providing a built-in low pass filter effect.

Amplifier 24 is powered by the output of regulator 21. The output of amplifier 24 drives a current source 26. In a preferred embodiment, current source 26 is a PNP transistor having an emitter coupled to the output voltage of regulator 21 and its base connected to the output of amplifier 24. The output of current source 26 is coupled back to the non-inverting input of amplifier 24. The output of current source 26 also goes to a storage capacitor 31 and an input of threshold detector 28. A second input for threshold detector 28 is connected to the output of amplifier 19. Current source 30 is in parallel with storage capacitor 31 and is coupled between the output of current source 26 and a ground terminal. Current source 30 is a controllable current source and serves to cause amplifier 24 to operate as a voltage follower during a predetermined period of time.

Amplifier 24 in conjunction with current sources 26 and 30 forms a transconductance amplifier connected in unity gain operating as a voltage follower. Current source 30 has an "on" or conducting state and an "off" or non-conducting state. Current source 30 is inherently limited to conduct a predetermined current when it is in the "on" state, and at this time the transconductance amplifier is complete and provides an output that follows the input. When current source 30 is "off" the output of current source 26 can only charge capacitor 31, it can not discharge capacitor 31 and therefore the peak of the input signal will be stored by capacitor 31. An example of a useable transconductance amplifier is disclosed in copending patent application Ser. No. 352,904 filed on the same day as the present application.

A clamp switch 27 which is powered by the voltage from regulator 21 is connected to amplifier 24. Clamp switch 27 is a controllable switch and serves to inhibit amplifier 24 from providing an output without turning amplifier 24 off. This technique provides faster capture time because the input stage is always tracking the input signal and therefore settling time from the capture is eliminated.

A threshold reference is connected to threshold detector 28. Threshold detector 28 provides an output to amplifier 33. The output of amplifier 33 is connected to a level shifter 39. Threshold detector 28 along with reference 32 and amplifier 33 operate to provide an amplifying comparator. Threshold reference 32 is powered by the output voltage from regulator 21 and is also connected to threshold adjust terminal 51 and to voltage reference terminal 17. Threshold adjust terminal 51 can be used to change a threshold reference of the comparator comprising threshold detector 28 and reference 32. The highest threshold detected can be achieved by connecting terminal 51 to ground. A lower threshold can be achieved by connecting terminal 51 to the reference voltage at terminal 17. If no connection is made to terminal 51 then a threshold in between the high and low thresholds will be obtained.

Switch 27 is controlled by an output from exclusive-OR gate 36. One input of exclusive-OR gate 36 is connected to clamp terminal 37 while the other input is connected to the Q output of a D-type flip-flop 41. The set (S) input of flip-flop 41 is also connected to clamp terminal 37. The D input of flip-flop 41 is connected to ground while the clock input is connected to the output of inverter 44. When a clamp signal is applied to terminal 37, flip-flop 41 is set to provide a logic level 1 at its Q output. When both inputs of exclusive-OR gate 36 are a logic level 1, its output is a logic level 0 which disables switch 27 thereby allowing current source 26 to charge capacitor 31 when the proper polarity signal is received at the input of amplifier 24. Whenever the two inputs of exclusive-OR gate 36 are different from each other its output will be a logic level 1 thereby enabling switch 27.

Inverter 44 receives its input from strobe terminal 38 and provides the reset (R) input to RS flip-flop 42 and a clock (C) input to D flip-flop 43 as well as the clock input to flip-flop 41. RS flip-flop 42 has its S and $\overline{S}$ inputs connected to respective outputs of level shifter 39. The Q and $\overline{Q}$ outputs of flip-flop 42 are connected to the D and $\overline{D}$ inputs respectively of flip-flop 43. The Q and $\overline{Q}$ outputs of flip-flop 43 are connected to output circuit 48. The output of output circuit 48 is connected to output terminal 53. Output circuit 48 is used to interface the current mode logic (CML) used within sense amplifier 10 to transistor to transistor logic (TTL). Chip select logic 49 provides a control signal to output circuit 48 and receives an input signal from $\overline{CS}$ terminal 52. Chip select logic 49 causes output circuit 48 to provide a high output impedance at output terminal 53 when $\overline{CS}$ terminal 52 is at a logic level 1. Chip select terminal 52 is useful when sense amplifier 10 and bubble memory device 11 are used in a system having a plurality of sense amplifiers and bubble memory devices.

The output of regulator 21 is also connected to a two $V_{BE}$ level shifter 34 and to a five $V_{BE}$ voltage regulator 46. The purpose of level shifter 34 is to provide the regulated voltage output of regulator 21 plus an additional voltage of two $V_{BE}$ to amplifier 33. The additional voltage is obtained by connecting level shifter 34 to voltage VCC terminal 23. This additional voltage is needed because level shifter 39 shifts the output of amplifier 33 in a negative direction and it was found more convenient to implement level shifter 39 as a zener plus one $V_{BE}$ drop. Since the output of voltage regulator 21 is 8.25 volts in a preferred embodiment the additional voltage supplied by level shifter 34 is needed to insure an adequate signal at the input of RS flip-flop 42. Level shifter 39 is powered from VCC terminal 23 and in conjunction with the level shifter 34 provides the proper voltage levels to the current mode logic used. Note that all the logic circuitry including flip-flops 41, 42, and 43 along with inverter 44, a portion of output circuit 48, and exclusive-OR gate 36 are all powered by regulator 46. The output portion of output circuitry 48 is powered by voltage regulator 47 which in a preferred embodiment provides an output voltage of 5.5 volts. Voltage regulator 47 is powered by voltage VCC appearing at terminal 23. The output signal appearing at terminal 53 is intended to be compatible with transistor-transistor logic (TTL).

In a preferred embodiment current mode logic is used in order to reduce total delay times in the logic circuitry. Use of voltage regulator 46 to provide an output voltage equal to five $V_{BE}$ drops allows the logic circuitry to be made smaller thus requiring less area because of the lower voltages used.

Control circuitry 14 causes the movement of a magnetic bubble beneath detector 12 which is a magneto-resistive material, amplifier 19 amplifies the difference between the signals appearing at its input to provide a positive output which is coupled to amplifier 24. In a typical bubble memory system, the sensed signal appearing at the input of amplifier 19 has a large negative going portion with a smaller positive going portion. When a bubble is present, the peak-to-peak amplitude of this input signal can range anywhere from less than 5 mV to near 20 mV depending upon the type and/or manufacturer of magnetic bubble memory device 11 which is used. Terminal 18 is provided for current reference 16 so that a resistor can be connected from terminal 18 to ground so the current reference can be set in a manner to sense the maximum possible output voltage from magnetic memory device 11. The first negative going portion of the input signal causes amplifier 24 to enable current source 26 which charges up storage capacitor 31, assuming current source 30 is disabled such as during the peak-to-peak detect mode. When the input signal starts to go positive amplifier 24 which serves as a single ended voltage follower no longer enables current source 26; however, an output from amplifier 19 also is coupled to the input threshold detector 28 and this allows threshold detector 28 to compare the peak-to-peak amplitude of the input signal against the threshold reference provided by reference 32. Input bias current cancellation circuit 29 supplies the input bias current to threshold detector 28 and to amplifier 24 to prevent the input circuits from drawing current from storage capacitor 31 and slowly discharging capacitor 31 thereby resulting in an erroneous reading. In a preferred embodiment, there will be a compensation capacitor connected from amplifier 24 to ground for stability purposes. This compensation capacitor along with storage capacitor 31 are small enough to permit the entire sense amplifier enclosed within dotted line 10 to be integrated on a single integrated circuit chip.

When reference 32 is exceeded, threshold detector 28 will provide an output to amplifier 33. The output of amplifier 33 is shifted downward by level shifter 39 and provides an output compatible with the current mode logic employed in flip-flop 42. When the reset input to flip-flop 42 is at a logic low level a logic 1 will appear at the Q output if a logic 1 appears at the set input. This logic 1 is then stored in D flip-flop 43 when the clock signal (C) to flip-flop 43 goes from a low level to a high level. This stored signal appears at the Q output of flip-flop 43 and is outputted by the current mode logic (CML) to transistor to transistor logic (TTL) output circuitry 48.

Sense amplifier 10 can operate with clamp and strobe signals which are typically used in magnetic bubble memory sense amplifiers and is also capable of operating with a single control signal being applied to clamp terminal 37 and strobe terminal 38 simultaneously. The single control signal required or in the case where clamp and strobe signals both are used are supplied by control circuit 14.

Figure 2:
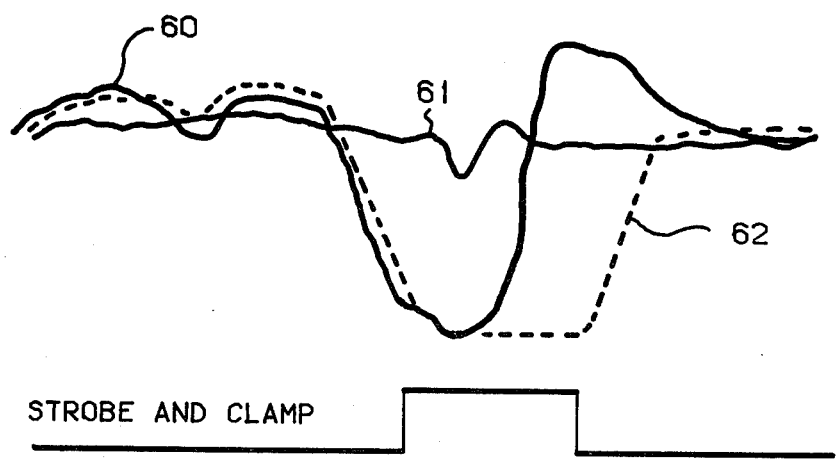
FIG. 2 illustrates in graphical form a first mode of operation of the circuitry of FIG. 1.

FIG. 2 illustrates the use of sense amplifier 10 with a single control signal. A single control signal is simplier to use since it requires less input signals and reduces the complexity of the control circuitry; however, the single control input signal should only be used with magnetic bubble memory devices which do not exhibit large transients on the input signal to the sense amplifier. Use of a single control signal eliminates any possible skewing problems between multiple control signals. Waveform 60 illustrates a typical signal provided by magnetic bubble device 11 when a bubble passes beneath the resistive detector. Waveform 61 represents the waveform typically provided by a bubble memory device when a zero or no bubble passes beneath the resistive detector. Dotted waveform 62 represents the output to storage capacitor 31. The single control signal is applied to terminals 37 and 38 simultaneously. When the positive portion of the control signal appears at terminal 37, D type flip-flop 41 provides a logic level 1 at its Q output. This logic level 1 is connected to current source 30 which inhibits or disables current source 30 so that storage capacitor 31 is not discharged. At the same time the logic level high along with the high signal appearing at terminal 37 are applied to exclusive-OR gate 36 causing the output of exclusive-OR gate 36 to be a logic level 0. This logic level 0 inhibits clamp switch 27 so that switch 27 performs no function during this period of time.

The single control signal also appears at terminal 38 which is inverted by inverter 44 and connected to the clock inputs of flip-flops 41 and 43 and to the reset input of flip-flop 42. Since the signal is inverted by inverter 44 it will appear as a low level logic signal to the flip-flops allowing RS flip-flop 42 to pass a logic level 1 on its S input to its Q output while not causing D flip-flops 41 and 43 to change states. However, when the output of inverter 44 goes from the low to a high logic level the Q output of flip-flop 41 will go to a logic level 0 since the D input is connected to ground, and the Q output of flip-flop 43 will change to the state of the logic level appearing at its D input. The logic high level appearing at the reset input of flip-flop 42 will cause the Q output to go to a zero level. To avoid any race condition occurring between flip-flops 42 and 43 an RC delay can be used at the reset input of flip-flop 42 to cause the reset signal to be delayed slightly thereby insuring that when the Q output of flip-flop 42 is a logic level 1 this logic level 1 will be transferred into flip-flop 43 before flip-flop 42 is reset.

Figure 3:
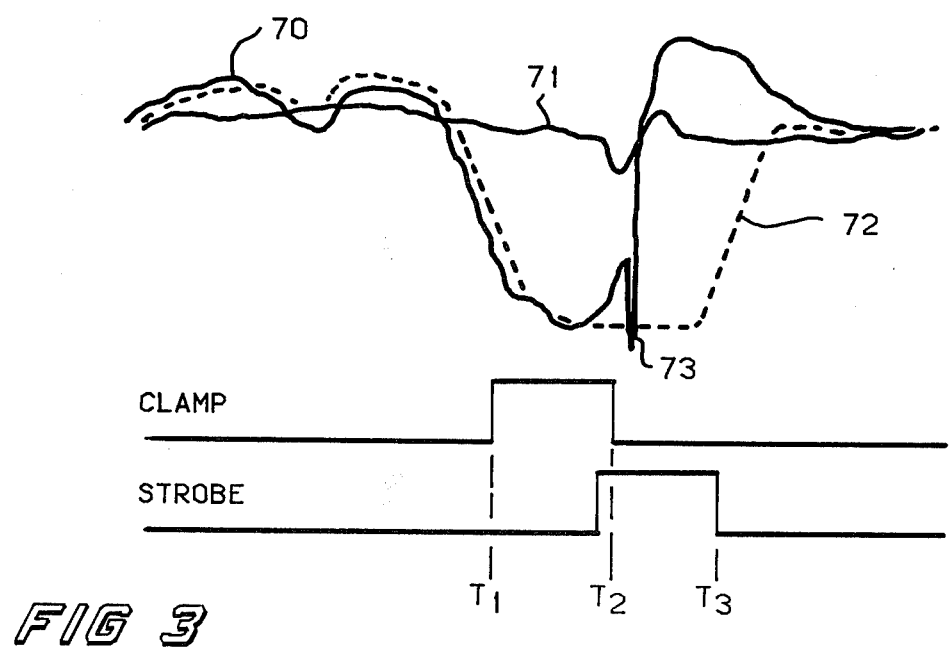
FIG. 3 illustrates in graphical form a second mode of operation of the circuitry of FIG. 1.

FIG. 3 illustrates the use of sense amplifier 10 with an individual clamp and an individual strobe control signals. Waveform 70 represents the input signal when a bubble is present while waveform 71 represents the input signal when there is no bubble present. Dotted waveform 72 represents the output to storage capacitor 31. Note that on waveform 70 a large transient or spike 73 occurs. This is typical of many magnetic bubble memory devices and is believed to be caused by the switching currents to the coils which move the bubbles around on the magnetic bubble memory device. Since this spike can cause erroneous readings it is preferred to not sample the input signal during this period of time. When the clamp signal is high, sense amplifier 10 is searching for the negative peak. This searching occurs between timing marks T1 and T2. When the clamp signal goes low, at timing mark T2, the output of exclusive-OR gate 36 will go to a logic level 1 thereby causing clamp switch 27 to become active and inhibit the output of amplifier 24. This allows the input to continue to track the signal without having the output of amplifier 24 respond to the large negative spike 73. When the strobe signal goes high, the output of inverter 44 goes low thereby causing no changes to the flip-flops. Note that the output of flip-flop 41 remains a logic 1 level which was caused by the logic 1 level applied to its set (S) input. The peak stored by storage capacitor 31 is held between timing marks T2 and T3 for comparison. At the end of the strobe signal, at timing mark T3, the output of inverter 44 will go to a logic level 1 thereby causing flip-flop 43 to store the information from flip-flop 42, resetting flip-flop 42, and setting the Q output of flip-flop 41 to a logic level 0. A logic level 0 on the Q output of flip-flop 41 will enable current source 30 thereby returning amplifier 24 and current sources 26 and 30 to the voltage follower mode. Since at this point in time both inputs of exclusive-OR gate 36 are a logic level 0 its output will be a logic level 1 allowing amplifier 24 to fully respond to the next input.

By now it should be appreciated that there has been provided an improved sense amplifier which is particularly useful with magnetic bubble memory devices. Input amplifier 19 along with storage amplifier 24 each use PNP transistors which provide the correct level shifts and input impedances and also limit the frequency response of the system providing rejection of unwanted signals resulting from system noise such as a fast rise and fall noise spikes from the X and Y coil currents of the magnetic bubble memory device 11. The PNP transistors will respond to the bubble rise and fall time but only at an attenuated degree to the fast noise spikes and therefore provide a low pass filter effect. Storage capacitor 31 is charged with a PNP transistor because the reverse bias collector junction of a lateral PNP transistor has lower capacitance than a forward biased emitter junction of an NPN transistor. In addition, the PNP transistor remains reverse biased during the transition from the peak search to the hold mode eliminating any error induced by the charge coupling from the junction capacitance to the storage capacitor. Another key feature of the improved sense amplifier is the onboard voltage regulator. This regulator isolates the rest of the circuit from the system supply which often has noise in excess of the signal from the bubble detectors. If this noise were allowed to influence the rest of the circuit in the sense amplifier, false triggering of the comparator would result in errors.

Improved sense amplifier 10 provides peak-to-peak signal detector which is used for comparison to a threshold voltage by a comparator. The comparator has the capability to be set to various threshold levels by simple connection of threshold adjust terminal 51. The output of the comparator is followed by RS flip-flop 42 and D flip-flop 43 which are used to store the data read from a sense channel until just prior to the subsequent data bit to be read. By having an RS flip-flop as well as a D flip-flop in series, clocking problems caused by skewing are eliminated and the detected signal is kept from changing prematurely. Sense amplifier 10 also has the capability of being operated with only one control signal or with separate clamp and strobe control signals.

We claim:

1. In combination with a magnetic bubble memory system having a magnetic bubble memory device, a dummy detector, a detector which changes resistance in response to movement of a magnetic bubble adjacent thereto, control means for effecting movement of magnetic bubbles adjacent to the detector, and a sense amplifier, the sense amplifier comprising: a constant current source for providing a current flow through the dummy detector and through the detector at a level determined by a reference voltage; an amplifier coupled to the detector for amplifying a signal sensed by the detector; a clamp switch coupled to the amplifier to prevent the amplifier from responding to the signal during a predetermined time; means for storing an output from the amplifier, the means for storing being coupled to the amplifier; a comparator coupled to the means for storing for comparing the output stored therein to a predetermined reference, the comparator providing an output when the stored output exceeds the predetermined reference; and a flip-flop coupled to the output of the comparator, the flip-flop providing a predetermined output level when the comparator provides an output.

2. The sense amplifier of claim 1 further including an output stage coupled to the output of the flip-flop for providing an output compatible with a circuit coupled thereto.

3. The sense amplifier of claim 1 further including a voltage regulator integrated on the same integrated circuit chip as the sense amplifier for providing regulated voltage to the sense amplifier.

4. The sense amplifier of claim 3 wherein the voltage regulator is a high frequency ripple rejection voltage regulator.

5. The sense amplifier of claim 4 wherein the amplifier is a low frequency amplifier using PNP transistors to achieve the low frequency response.

6. A sense amplifier for detecting low amplitude signals, the sense amplifier having an input and an output, the sense amplifier comprising: a low frequency amplifier coupled to the input; means coupled to the low frequency amplifier to controllably prevent the low frequency amplifier from providing an output; a current source coupled to the low frequency amplifier and providing an output current in response to the low frequency amplifier; means for storing coupled to the current source to store the output current; a comparator coupled to the means for storing for comparing the stored output current to a predetermined reference, the comparator providing an output when the stored output current exceeds the predetermined reference; and a logic circuit for temporarily storing the output of the comparator.

7. The sense amplifier of claim 6 wherein the logic circuit has an R-S flip-flop for receiving the output of the comparator and a D flip-flop coupled to the R-S flip-flop for receiving an output from the RS flip-flop.

8. The sense amplifier of claim 6 wherein the means for storing is a capacitor and stores the output current in a maximum amplitude in a first polarity so that the comparator can compare a peak-to-peak amplitude of a signal appearing at the input of the sense amplifier to the predetermined reference.

9. A sense amplifier for sensing a low amplitude signal and providing an output based on the low amplitude signal, the sense amplifier comprising: an input amplifier for providing an amplified output of the low amplitude signal; a filtering amplifier coupled to the input amplifier for providing a filtered output; a current source coupled to the filtering amplifier and being controlled by the filtered output; means for disabling coupled to the filtering amplifier for controllably inhibiting the filtered output; a storage capacitor coupled to the current source for storing charge supplied by the current source; and a threshold detector coupled to the storage capacitor and to the amplified output to detect when the total peak-to-peak voltage exceeds a predetermined level.

10. The sense amplifier of claim 9 further including an R-S flip-flop coupled to the output of the threshold detector and a D flip-flop coupled to the R-S flip-flop for temporarily storing an output thereof.

11. A magnetic bubble memory sense amplifier for use with a magnetic bubble memory, comprising: a first current source for providing current to a bubble detector located on the magnetic bubble memory; an input amplifier for receiving a signal from the bubble detector; a low pass filtering amplifier coupled to the input amplifier and receiving an input from the input amplifier, the low pass filtering amplifier having an input stage and an output stage; a second current source coupled to the low pass filtering amplifier and controlled by an output from the low pass filtering amplifier; a capacitor coupled to the second current source for storing an output from the second current source; means coupled in parallel with the capacitor for controllably discharging the capacitor; a threshold detector coupled to the capacitor and providing an output when a signal stored by the capacitor exceeds a predetermined value; a bias cancellation circuit coupled to the capacitor to compensate for any current drawn from the capacitor by the threshold detector; a reference circuit coupled to the threshold detector to provide a reference for the threshold detector; logic means coupled to the output of the threshold detector; a voltage regulator for providing power to portions of the sense amplifier; and switch means coupled to the output stage of the low pass filtering amplifier to controllably inhibit the output stage of the low pass filtering amplifier.

12. The magnetic bubble memory sense amplifier of claim 11 wherein the logic means includes an R-S flip-flop coupled to a D flip-flop.

* * * * *